US012707943B2

(12) United States Patent
Naoki et al.

(10) Patent No.: US 12,707,943 B2
(45) Date of Patent: Aug. 11, 2026

(54) METHOD FOR SEMICONDUCTOR PATTERNING USING ION IMPLANTED ORGANIC MASKS

(71) Applicant: SAMSUNG ELECTRONICS CO., LTD., Suwon-si (KR)

(72) Inventors: Inoue Naoki, Suwon-si (KR); Tsunehiro Nishi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 324 days.

(21) Appl. No.: 18/372,212

(22) Filed: Sep. 25, 2023

(65) Prior Publication Data

US 2024/0128082 A1 Apr. 18, 2024

(30) Foreign Application Priority Data

Oct. 14, 2022 (KR) ........................ 10-2022-0132721

(51) Int. Cl.

*H01L 21/033* (2006.01)
*H01L 21/027* (2006.01)
*H01L 21/311* (2006.01)

(52) U.S. Cl.

CPC ...... *H01L 21/0335* (2013.01); *H01L 21/0274* (2013.01); *H01L 21/0332* (2013.01); *H01L 21/0337* (2013.01); *H01L 21/31144* (2013.01)

(58) Field of Classification Search

CPC .. H01L 21/0273; H01L 21/033; H01L 21/314
See application file for complete search history.

(56) References Cited

U.S. PATENT DOCUMENTS

| | | | | |
|---|---|---|---|---|
| 9,523,917 | B2 | 12/2016 | Ban et al. | |
| 9,941,125 | B2 | 4/2018 | Yang et al. | |
| 10,078,263 | B2 | 9/2018 | Trefonas, III et al. | |
| 2013/0216776 | A1* | 8/2013 | Arnold | H01L 21/0332 430/323 |
| 2020/0251338 | A1* | 8/2020 | Mignot | H01L 21/3088 |
| 2021/0333710 | A1* | 10/2021 | Li | G03F 7/031 |

FOREIGN PATENT DOCUMENTS

| | | | |
|---|---|---|---|
| CN | 102347217 | A | 2/2012 |
| CN | 114284141 | A | 4/2022 |
| CN | 114420629 | A | 4/2022 |
| KR | 1020170018191 | A | 2/2017 |
| KR | 1020220025020 | A | 3/2022 |
| WO | WO 2022/016123 | A1 | 1/2022 |

* cited by examiner

*Primary Examiner* — William B Partridge
*Assistant Examiner* — Mehek Ahmed
(74) *Attorney, Agent, or Firm* — Muir Patent Law, PLLC

(57) ABSTRACT

A method of manufacturing a semiconductor device includes sequentially disposing a hard mask layer, an organic layer, and a metal-containing photoresist layer on a substrate, patterning the metal-containing photoresist layer to form a first mask pattern exposing a first region of the organic layer, implanting ions into the first region of the organic layer exposed by the first mask pattern, removing the first mask pattern and a second region of the organic layer that is not ion-implanted to form a second mask pattern exposing a partial region of the hard mask layer, and removing the partial region of the hard mask layer exposed by the second mask pattern to form a third mask pattern.

20 Claims, 22 Drawing Sheets

METHOD FOR SEMICONDUCTOR PATTERNING USING ION IMPLANTED ORGANIC MASKS

CROSS-REFERENCE TO RELATED APPLICATION

Korean Patent Application No. 10-2022-0132721, filed on Oct. 14, 2022, in the Korean Intellectual Property Office, is incorporated by reference herein in its entirety.

BACKGROUND

1. Field

A method of manufacturing a semiconductor device, particularly, a method of manufacturing a semiconductor device by using a metal-containing photoresist layer is disclosed.

2. Description of the Related Art

In accordance with the rapid development of the electronics industry and the needs of users, the size and weight of electronic devices have been increasingly reduced.

SUMMARY

Embodiments are directed to a method of manufacturing a semiconductor device, including sequentially disposing a hard mask layer, an organic layer, and a metal-containing photoresist layer on the substrate including patterning the metal-containing photoresist layer to form a first mask pattern exposing a first region of the organic layer, implanting ions into the first region of the organic layer exposed by the first mask pattern, removing the first mask pattern and a second region of the organic layer that is not ion-implanted to form a second mask pattern exposing a partial region of the hard mask layer, and removing the partial region of the hard mask layer exposed by the second mask pattern to form a third mask pattern.

Embodiments are directed to a method of manufacturing a semiconductor device, including providing a substrate in which an active region defined by a device isolation layer is located, forming a word line extending in a first horizontal direction within the substrate, forming an etch target layer on the substrate, sequentially forming a hard mask layer, an organic layer, and a metal-containing photoresist layer covering an etch target layer, patterning the metal-containing photoresist layer to form a first mask pattern exposing a first region of the organic layer, implanting ions into the first region of the organic layer exposed by the first mask pattern, removing the first mask pattern and a second region, that is not ion-implanted, of the organic layer to form a second mask pattern exposing a partial region of the hard mask layer, removing the partial region of the hard mask layer exposed by the second mask pattern to form a third mask pattern exposing a portion of the etch target layer, and etching the etch target layer using the third mask pattern.

Embodiments are also directed to a method of manufacturing a semiconductor device, including sequentially disposing an etch target layer, a hard mask layer, an organic layer, and a metal-containing photoresist layer on a substrate, negative-patterning the metal-containing photoresist layer to form a first mask pattern exposing a first region of the organic layer, implanting ions into the first region of the organic layer exposed by the first mask pattern, removing the first mask pattern, removing a second region, that is not ion-implanted, of the organic layer to form a second mask pattern exposing a partial region of the hard mask layer, removing the partial region of the hard mask layer exposed by the second mask pattern to form a third mask pattern exposing a portion of the etch target layer, and etching the etch target layer using the third mask pattern, and forming a pattern which is a reverse pattern of the first mask pattern.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, embodiments are described in detail with reference to the accompanying drawings.

Figure 1:
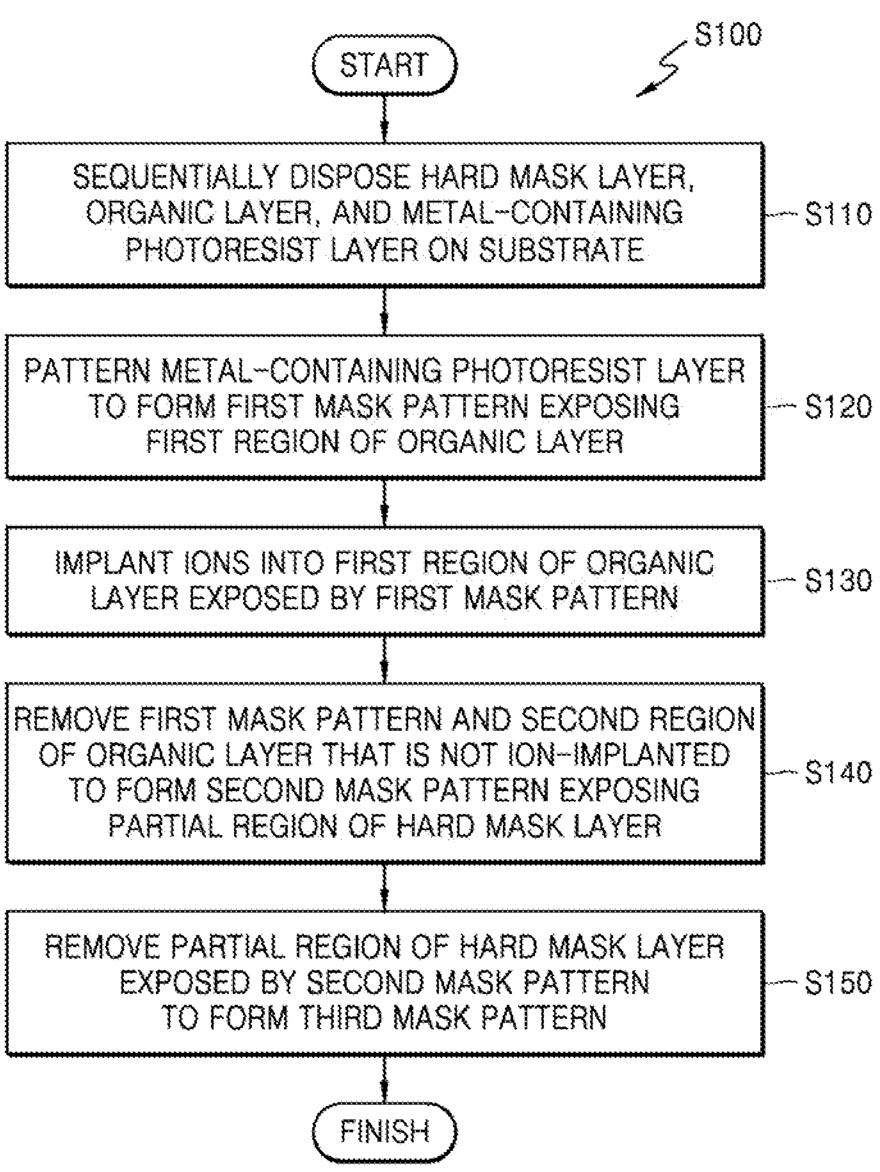
FIG. 1 is a flowchart illustrating a method of manufacturing a semiconductor device according to example embodiments.

FIG. 1 is a flowchart illustrating a method of manufacturing a semiconductor device (S100) according to example embodiments. FIGS. 2 to 8 are cross-sectional views illustrating a method S100 of manufacturing a semiconductor device according to example embodiments.

Figure 2:
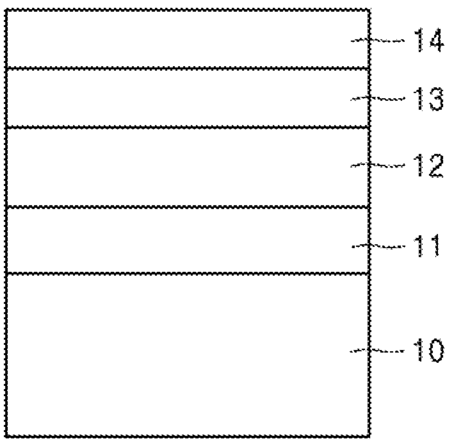
FIGS. 2 to 8 are cross-sectional views illustrating a method of manufacturing a semiconductor device according to example embodiments.

Referring to FIGS. 1 and 2, a hard mask layer 12, an organic layer 13, and a metal-containing photoresist layer 14 may be sequentially formed on a substrate 10 in operation S110.

The substrate 10 may include, e.g., silicon (Si), crystalline Si, polycrystalline Si, or amorphous Si. In some other embodiments, the substrate 10 may include a semiconductor element, such as germanium (Ge) or silicon germanium (SiGe), silicon carbide (SiC), gallium arsenide (GaAs), indium arsenide (InAs), or indium phosphide (InP). As used herein, the term "or" is not an exclusive term, e.g., "A or B" would include A, B or A and B.

An etch target layer 11 may be on the substrate 10. The etch target layer 11 may include one or more insulating layers, conductive layers, or combinations thereof. The etch target layer 11 may be a target layer of an etching process using the hard mask layer 12, the organic layer 13, and the metal-containing photoresist layer 14, which will be described below.

The hard mask layer 12 may be on the etch target layer 11. The hard mask layer 12 may be formed as, e.g., a spin on hardmask (SOH) layer. The SOH layer may include a carbon-based SOH layer or a silicon-based SOH layer. The hard mask layer 12 may include a material having an etch selectivity with the etch target layer 11 below the hard mask layer 12.

The organic layer 13 may be on the hard mask layer 12. The organic layer 13 may include an organic material. In an implementation, the organic layer 13 may include carbon (C), hydrogen (H), oxygen (O), or nitrogen (N).

The metal-containing photoresist layer 14 may be on the organic layer 13. The metal-containing photoresist layer 14 may include tin (Sn), antimony (Sb), cobalt (Co), hafnium (Hf), or palladium (Pd).

Figure 3:
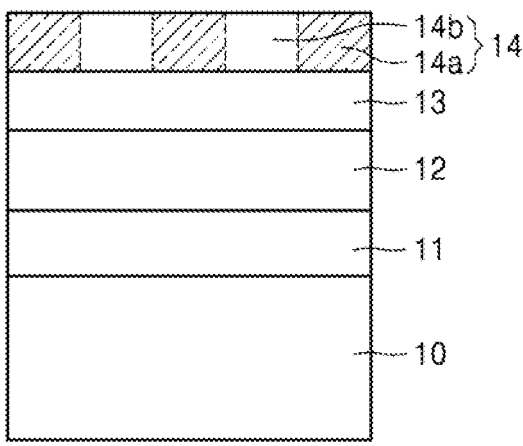
Figure 4:
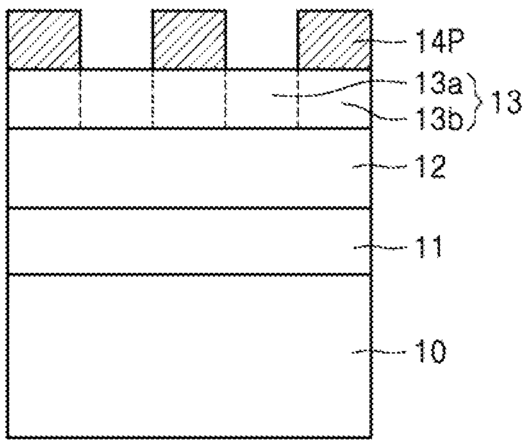

Referring to FIGS. 1, 3, and 4, the metal-containing photoresist layer 14 may be patterned to form a first mask pattern 14P exposing a first region 13*a* of the organic layer 13 (S120).

In some embodiments, the metal-containing photoresist layer 14 may include a to-be-exposed region 14*a* (or an exposure target region 14*a*) and a not-to-be-exposed region 14*b* (or a non-exposure target region 14*b*).

In some embodiments, the patterning of the metal-containing photoresist layer 14 may include exposing (E1) only the exposure target region 14*a* of the metal-containing photoresist layer 14 and removing the non-exposure target region 14*b* to form the first mask pattern 14P. That is, the patterning of the metal-containing photoresist layer 14 may include negative-patterning the metal-containing photoresist layer 14.

In some embodiments, when the exposure target region 14*a* of the metal-containing photoresist layer 14 is exposed (E1), ligand bonded to metal included in the metal-containing photoresist layer 14 of the exposure target region 14*a* may be desorbed and the metal may form a metal oxide. When the exposure target region 14*a* of the metal-containing photoresist layer 14 is exposed, solubility thereof may be different from that of the non-exposure target region 14*b*. In an implementation, when the exposure target region 14*a* of the metal-containing photoresist layer 14 is exposed, solubility in a photoresist developer may be reduced, compared to the non-exposure target region 14*b*.

In some embodiments, the non-exposure target region 14*b* of the metal-containing photoresist layer 14 may be removed, and the exposed exposure target region 14*a* of the metal-containing photoresist layer 14 may remain. As the non-exposure target region 14*b* of the metal-containing photoresist layer 14 is removed, a partial region of the organic layer 13 may be exposed. A first region 13*a* of the organic layer 13 may be exposed.

In other words, the first mask pattern 14P including the metal oxide formed by exposing the metal of the metal-containing photoresist layer 14 and exposing the first region 13*a* of the organic layer 13 may be formed.

The first mask pattern 14P may include tin oxide ($SnO_x$), tin carboxylate (Sn-carboxylate), antimony acrylate (Sb-acrylate), cobalt oxalate (Co-oxalate), hafnium oxide nanoparticles ($HfO_x$ nanoparticles), or palladium oxalate (Pd-oxalate).

Figure 5:
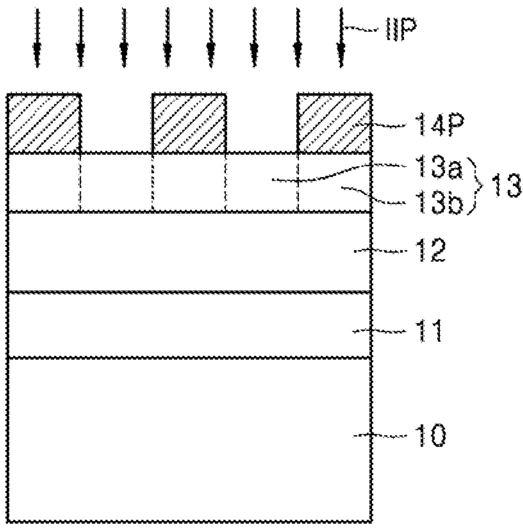

Referring to FIGS. 1 and 5, ions may be implanted into the first region 13*a* of the organic layer 13 exposed by the first mask pattern 14P (S130). Ion implantation IIP may be performed on the exposed first region 13*a* using the first mask pattern 14P as a mask to cover a region not to be ion-implanted (e.g., the second region 13*b*).

In some embodiments, ions implanted into the first region 13*a* of the organic layer 13 may include boron ions, carbon ions, argon ions, phosphorus ions, sulfur ions, or arsenic ions.

In some embodiments, a method of manufacturing a semiconductor device without an optical proximity correction (OPC) may include forming the first mask pattern 14P which may be used in the ion implantation process on the first region 13*a* of the organic layer 13. Undesirable shrinkage that may occur in the mask due to energy that may be applied during the ion implantation process may be improved using the first mask pattern 14P that may include a metal oxide. Accordingly, a semiconductor device manufacturing method that does not require OPC correction and also has an improved performance and reliability may be provided.

In some embodiments, etch selectivity of the first region 13*a* of the organic layer 13 may be changed by the ion implantation process performed on the first region 13*a* of the organic layer 13. Etch selectivity of the first region 13*a* of the organic layer 13 with respect to the second region 13*b* that is not ion-implanted may be increased by the ion implantation process. In an implementation, etch resistivity of the first region 13*a* of the organic layer 13 may increase, compared to that of the second region 13*b* that is not ion-implanted. In an implementation, resistance to wet etching and/or dry etching of the first region 13*a* of the organic layer 13 may increase, compared to the second region 13*b* that is not ion-implanted. Etch selectivity of the first region 13*a* of the organic layer 13 with respect to the hard mask layer 12 may be increased by the ion implantation. In an implementation, etch resistance of the first region 13*a* of the organic layer 13 may increase, compared to that of the hard mask layer 12. In an implementation, the first region 13*a* of the organic layer 13 may have an increased resistance to a dry cleaning process, compared to the hard mask layer 12. The dry cleaning process may be cleaning a silicon wafer without chemical solvents, and may include vapor phase dry cleaning or beam cleaning technology.

In the operation (S120) of forming the first mask pattern 14P by removing a partial region of the unexposed region from the metal-containing photoresist layer 14, the partial region of the unexposed region may not be completely removed to form a remaining portion. In example embodiments, when the partial region that is not exposed is not completely removed to form the remaining, the ion implantation process may be performed to pass through the remaining portion, and therefore, the ion implantation process may be performed on the first region 13*a* that is initially intended. Accordingly, a method of manufacturing a semiconductor device having improved performance and reliability may be provided.

Figure 6:
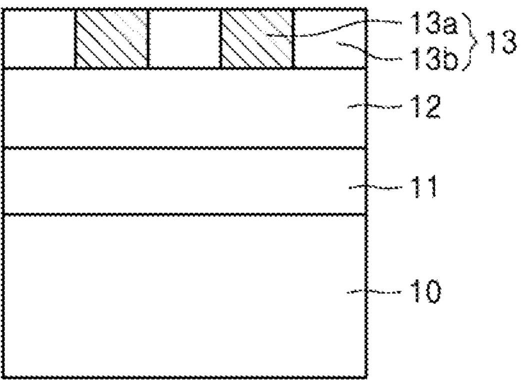
Figure 7:
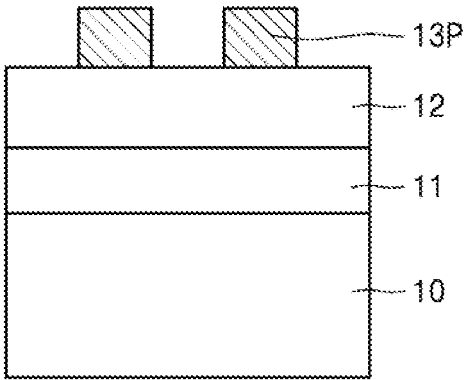

Referring to FIGS. 1, 6, and 7, the first mask pattern 14P (shown in FIG. 5) and the second region 13*b* (which is not ion-implanted), of the organic layer 13 may be removed to form a second mask pattern 13P. As seen in FIGS. 6 and 7, when the first mask pattern 14P and the second region 13*b* are removed, a portion of the hard mask layer 12 may be exposed.

In some embodiments, the first mask pattern 14P may be removed using a wet etching process or a dry etching process. A wet etching process using a Piranha solution may be used as an etching solution. In an implementation, a wet etching process in which the etching solution includes a sulfuric acid-peroxide mixture (SPM) solution including a mixture of sulfuric acid and peroxide may be used. A wet etching process using an ammonium hydroxide-peroxide mixture (APM) solution including a hydrogen fluoride (HF) aqueous solution or a mixture of ammonium hydroxide and peroxide be used. A dry etching process using chlorine ($Cl_2$) gas or boron trichloride ($BCl_3$) gas may may be used.

In some embodiments, the second region 13*b*, which is not ion-implanted, of the organic layer 13 may be removed using a wet etching process or a dry etching process. A wet etching process may use a Piranha solution, e.g., a sulfonic peroxide mixture (SPM) solution including a mixture of sulfuric acid and peroxide, an aqueous hydrogen fluoride (HF) solution, or an ammonium hydroxide-peroxide mixture (APM) including a mixture of ammonium hydroxide and peroxide. A dry etching process using oxygen ($O_2$) and nitrogen ($N_2$) gas may be used.

As described above, by the ion implantation process (S130) performed on the first region 13*a* of the organic layer 13, etch selectivity of the first region 13*a* of the organic layer 13 to the second region 13*b* that is not ion-implanted may increase, and thus, only the second region 13*b* may be removed by the wet etching and/or dry etching process performed in operation S140.

In some embodiments, the second mask pattern 13P exposing a portion of the hard mask layer 12 may be a reverse pattern of the first mask pattern 14P. That is, the partial region of the hard mask layer 12 exposed by the second mask pattern 13P may be the reverse of the first region 13*a* of the organic layer 13 exposed by the first mask pattern 14P.

Figure 8:
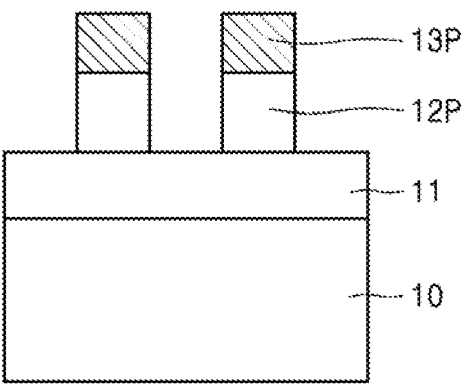

Referring to FIGS. 1 and 8, a partial region of the hard mask layer 12 (shown in FIG. 7) exposed by the second mask pattern 13P may be removed to form a third mask pattern 12P (S150).

In some embodiments, removing a partial region of the hard mask layer 12 exposed by the second mask pattern 13P may include a dry strip process using a gas including fluorine (F). As described above, etch selectivity of the first region 13*a* of the organic layer 13 to the hard mask layer 12 may increase by the ion implantation process (S130) performed on the first region 13*a* of the organic layer 13 (refer to FIG. 5), and thus, only a partial region of the hard mask layer 12 exposed by the second mask pattern 13P may be removed by the dry strip process.

In some embodiments, the third mask pattern 12P formed by removing the partial region of the hard mask layer 12 may expose a partial region of the etch target layer 11. In a subsequent semiconductor device manufacturing process, the etch target layer 11 may be etched using the third mask pattern 12P as an etch mask.

In some embodiments, the third mask pattern 12P formed by removing the partial region of the hard mask layer 12 may be a reverse pattern of the first mask pattern 14P. In some embodiments, a partial region of the etch target layer 11 exposed by the third mask pattern 12P may be the reverse of the first region 13*a* of the organic layer 13 (shown in FIG. 4) exposed by the first mask pattern 14P.

In this specification, the method of manufacturing a semiconductor device (S100) according to example embodiments has been described with reference to FIGS. 1 to 8. According to embodiments, the method of manufacturing a semiconductor device in which a pattern is reversed may be provided.

Figure 9:
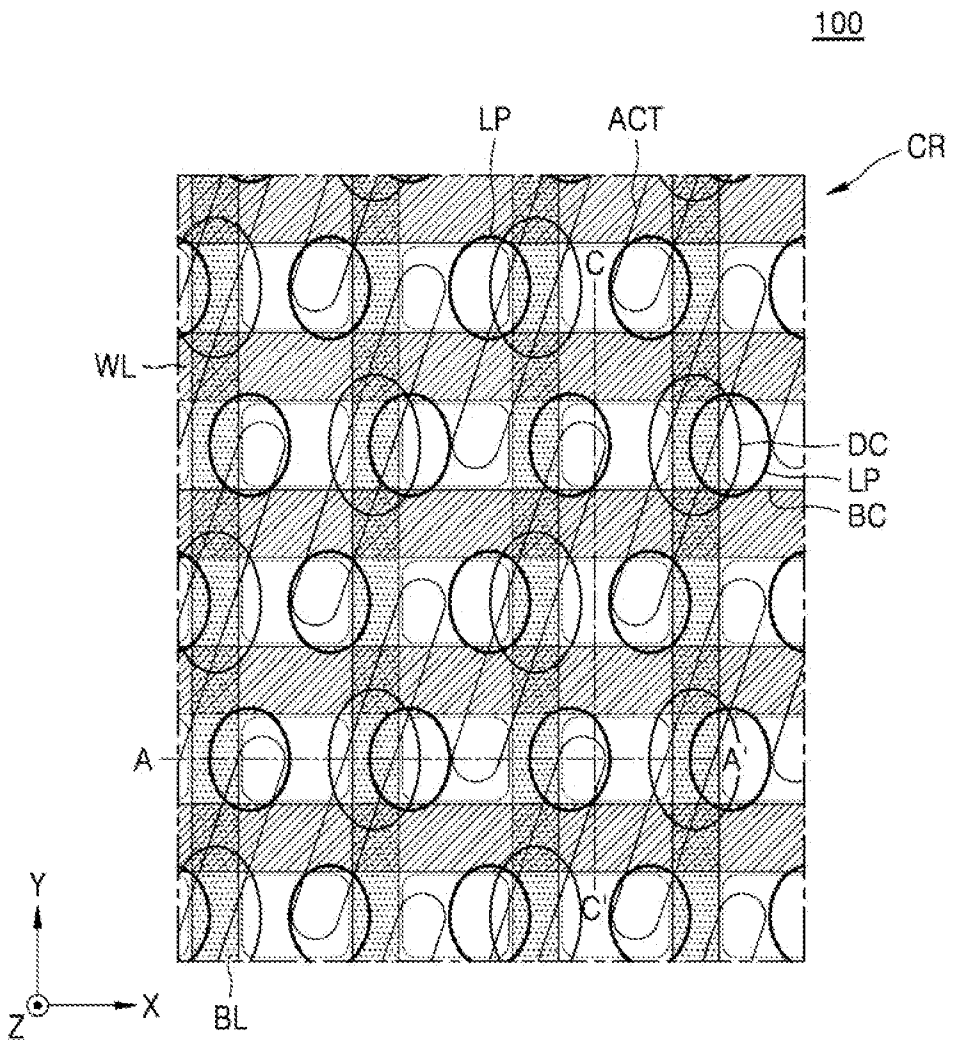
FIG. 9 is a schematic planar layout illustrating main components of a semiconductor device according to example embodiments.
Figure 10A:
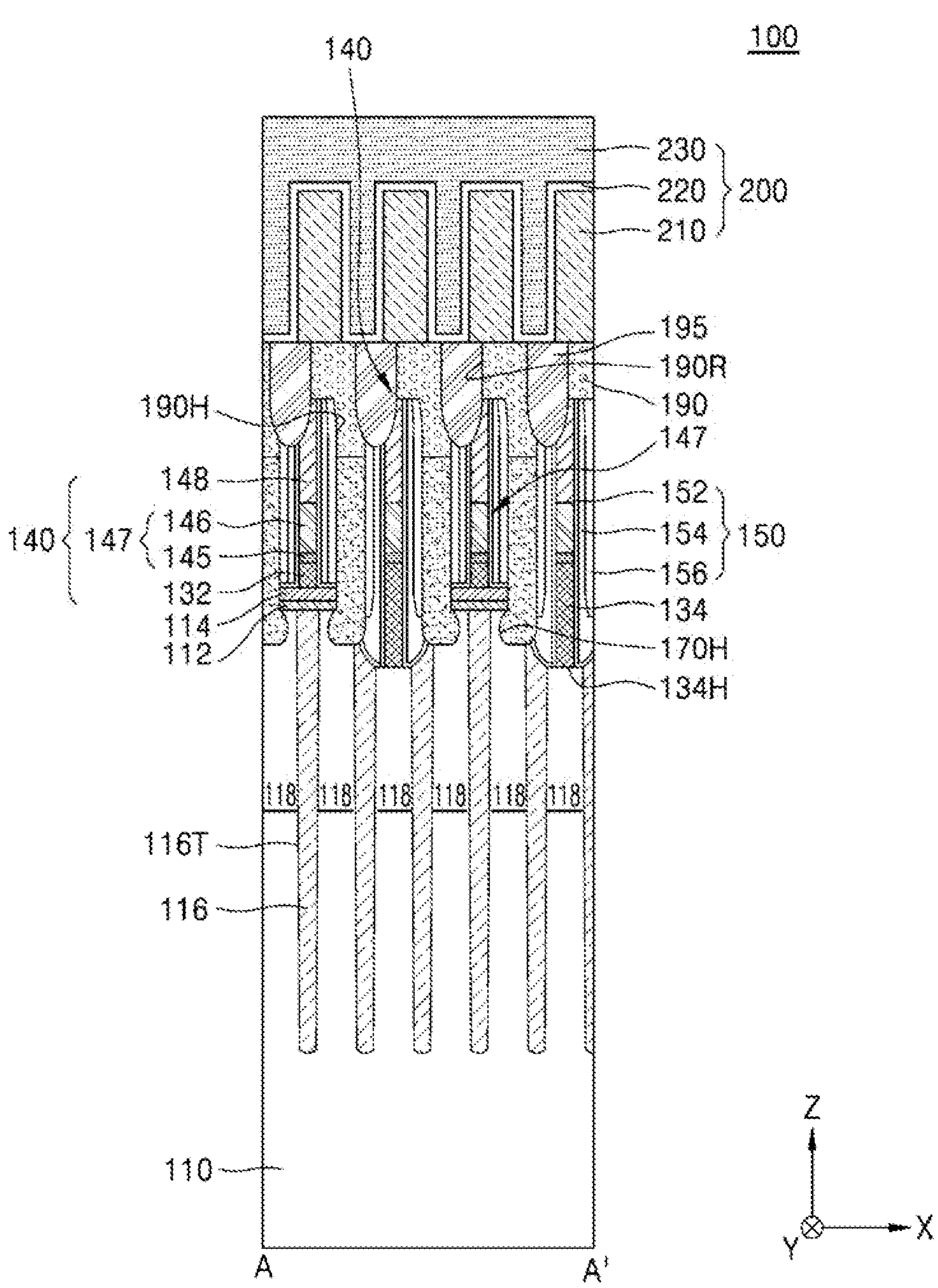
FIGS. 10A and 10B are cross-sectional views illustrating a semiconductor device according to example embodiments.
Figure 10B:
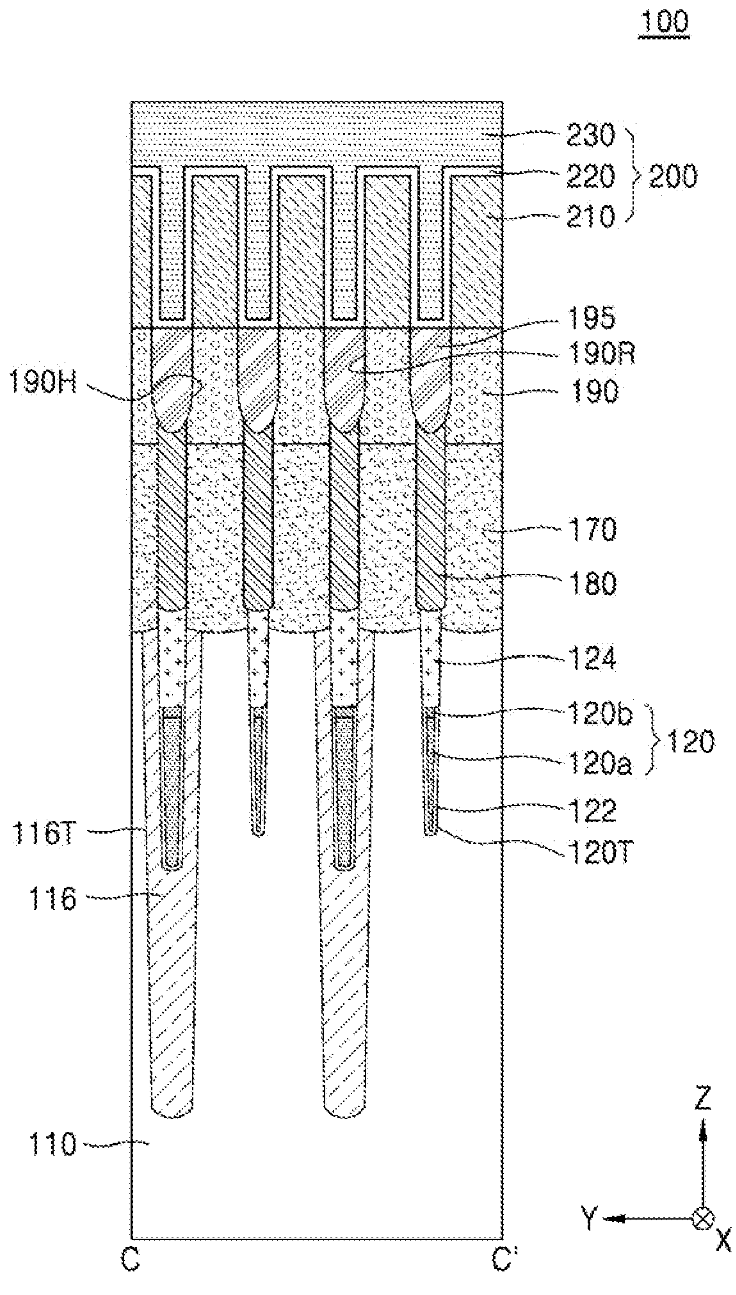

FIG. 9 is a schematic plan layout illustrating main components of a semiconductor device according to example embodiments. FIGS. 10A and 10B are cross-sectional views illustrating a semiconductor device 100 according to example embodiments. FIGS. 10A and 10B are cross-sectional views taken along lines A-A' and C-C' of FIG. 9.

Referring to FIG. 9, the semiconductor device 100 may include a plurality of active regions ACT formed in a memory cell region CR. In some embodiments, the active regions ACT located in the memory cell region CR may be located to have the major axis in an oblique direction with respect to a first horizontal direction (an X direction) and a second horizontal direction (a Y direction). The active regions ACT may constitute a plurality of active regions 118 illustrated in FIGS. 10A and 10B.

A plurality of word lines WL may extend parallel to each other in the first horizontal direction (the X direction) across the active regions ACT. A plurality of bit lines BL may extend parallel to each other the second horizontal direction (the Y direction) crossing the first horizontal direction (the X direction) on the word lines WL.

In some embodiments, a plurality of buried contacts BC may be formed between two adjacent bit lines BL among the bit lines BL. In some embodiments, the buried contacts BC may be arranged in a line in each of the first horizontal direction (the X direction) and the second horizontal direction (the Y direction).

A plurality of landing pads LP may be formed on the buried contacts BC. The landing pads LP may be arranged to at least partially overlap the buried contacts BC. In some embodiments, each of the landing pads LP may extend to an upper portion of one of two mutually adjacent bit lines BL.

A plurality of storage nodes may be formed on the landing pads LP. The storage nodes may be formed on the bit lines BL. Each of the storage nodes may be a lower electrode of a plurality of capacitors. The storage node may be connected to the active region ACT through the landing pad LP and the buried contact BC.

The semiconductor device 100 may be a dynamic random access memory (DRAM) device.

Referring to FIGS. 10A and 10B together, the semiconductor device 100 may include a substrate 110 including a plurality of active regions 118 defined by a device isolation layer 116 and a plurality of word line trenches 120T crossing the active regions 118, a plurality of word lines 120 located inside the word line trenches 120T, a plurality of bit line structures 140, and a plurality of capacitor structures 120 including a plurality of lower electrodes 210, a capacitor dielectric layer 220, and an upper electrode 230.

The substrate 110 may include, e.g., silicon (Si), crystalline Si, polycrystalline Si, or amorphous Si. In some other embodiments, the substrate 110 may include a semiconductor element, such as germanium (Ge), and silicon germanium (SiGe), silicon carbide (SiC), gallium arsenide (GaAs), indium arsenide (InAs), or indium phosphide (InP). In some embodiments, the substrate 110 may have a silicon on insulator (SOI) structure. In an implementation, the substrate 110 may include a buried oxide (BOX) layer. The substrate 110 may include a conductive region, e.g., a well doped with impurities or a structure doped with impurities.

The active regions 118 may be a portion of the substrate 110 defined by the device isolation trench 116T. The active regions 118 may have a relatively long island shape having major and minor axes in a plan view. In some embodiments, the active regions 118 may be arranged to have major axes in an oblique direction with respect to the first horizontal direction (the X direction) and the second horizontal direction (the Y direction). The active regions 118 may extend to have substantially the same length in a major axis direction and may be repeatedly arranged with a substantially constant pitch.

The device isolation layer 116 may fill the device isolation trench 116T. The active regions 118 may be defined by the device isolation layer 116 on the substrate 110.

In some embodiments, the device isolation layer 116 may include a triple layer including a first device isolation layer, a second device isolation layer, and a third device isolation layer. In an implementation, the first device isolation layer may conformally cover inner and lower surfaces of the device isolation trench 116T. In some embodiments, the first device isolation layer may include silicon oxide. In an implementation, the second device isolation layer may conformally cover the first device isolation layer. In some embodiments, the second device isolation layer may include silicon nitride. In an implementation, the third device isolation layer may cover the second device isolation layer and fill the device isolation trench 116T. In some embodiments, the third device isolation layer may include silicon oxide. In an implementation, the third device isolation layer may include silicon oxide including tonen silazene (TOSZ). In some embodiments, the device isolation layer 116 may include a single layer including one type of insulating layer, a double layer including two types of insulating layers, or a multi-layer including a combination of at least four types of insulating layers. In an implementation, the device isolation layer 116 may include a single layer including silicon oxide.

The word line trenches 120T may be formed in the substrate 110 including the active regions 118 defined by the device isolation layer 116. The word line trenches 120T may extend parallel to each other in the first horizontal direction (the X direction) and may be arranged to cross the active region 118 and have substantially equal intervals in the second horizontal direction (the Y direction), having a line shape. In some embodiments, steps may be formed on bottom surfaces of the word line trenches 120T.

A plurality of gate dielectric layers 122, a plurality of word lines 120, and a plurality of dummy buried insulating layers 124 may be sequentially formed inside the word line trenches 120T. The word lines 120 may constitute the word lines WL illustrated in FIG. 9. The word lines 120 may extend in parallel in the first horizontal direction (the X direction) and may be arranged to cross the active region 118 and have substantially equal intervals in the second horizontal direction (the Y direction), having a line shape. An upper surface of each of the word lines 120 may be at a vertical level lower than an upper surface of the substrate 110. Bottom surfaces of the word lines 120 may have concavo-convex shapes, and saddle fin structure transistors (saddle FinFETs) may be formed in the active regions 118.

The word lines 120 may fill lower portions of the word line trenches 120T. Each of the word lines 120 may have a stack structure of a lower word line layer 120*a* and an upper word line layer 120*b*. In an implementation, the lower word line layer 120*a* may conformally cover inner walls and bottom surface of lower portions of the word line trenches 120T with the gate dielectric layer 122 therebetween. In an implementation, the upper word line layer 120*b* may cover the lower word line layer 120*a* and may fill a lower portion of the word line trench 120T with the gate dielectric layer 122 therebetween. In some embodiments, the lower word line layer 120*a* may include a metal material, such as Ti, TiN, Ta, or TaN, or a conductive metal nitride. In some embodiments, the upper word line layer 120*b* may include, e.g., doped polysilicon, a metal material, such as W, or a conductive metal nitride, such as WN, TiSiN, or WSiN.

A source region and a drain region formed by implanting impurity ions into the active region 118 may be located in the portion of the active region 118 of the substrate 110 on both sides of the word lines 120.

The gate dielectric layer 122 may cover the inner walls and bottom surface of the word line trench 120T. In some embodiments, the gate dielectric layer 122 may extend from between the word line 120 and the word line trench 120T to between the dummy buried insulating layer 124 and the word line trench 120T. The gate dielectric layer 122 may include silicon oxide, silicon nitride, silicon oxynitride, oxide/nitride/oxide (ONO), or a high-k dielectric material having a dielectric constant higher than that of silicon oxide. In an implementation, the gate dielectric layer 122 may have a dielectric constant of about 10 to about 25. In some embodiments, the gate dielectric layer 122 may include hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO). In an implementation, the gate dielectric layer 122 may include $HfO_2$, $Al_2O_3$, $HfAlO_3$, $Ta_2O_3$, or $TiO_2$.

The dummy buried insulating layers 124 may fill upper portions of the word line trenches 120T. In some embodiments, upper surfaces of the dummy buried insulating layers 124 may be at substantially the same vertical level as that of the upper surface of the substrate 110. The dummy buried insulating layer 124 may include material layer selected from silicon oxide, silicon nitride, or silicon oxynitride. In an implementation, the dummy buried insulating layer 124 may include silicon nitride.

Insulating layer patterns 112 and 114 may be on the device isolation layer 116, the active regions 118, and the dummy buried insulating layers 124. In an implementation, the insulating layer patterns 112 and 114 may include silicon oxide, silicon nitride, silicon oxynitride, or a metal-based dielectric material. In some embodiments, the insulating layer patterns 112 and 114 may have a stack structure including first and second insulating layers. In some embodiments, the first insulating layer pattern 112 may include silicon oxide, and the second insulating layer pattern 114 may include silicon oxynitride. In some other embodiments, the first insulating layer pattern 112 may include a non-metal-based dielectric material, and the second insulating layer pattern 114 may include a metal-based dielectric material. In some embodiments, the second insulating layer pattern 114 may be thicker than the first insulating layer pattern 112. In an implementation, the first insulating layer pattern 112 may have a thickness of about 50 Å to about 90 Å, and the second insulating layer pattern 114 may be thicker than the first insulating layer pattern 112 and may have a thickness of about 60 Å to about 100 Å.

The direct contacts 134 may fill portions of direct contact holes 134H that pass through the insulating layer patterns 112 and 114 to expose a source region in the active region 118. In some embodiments, the direct contact hole 134H may extend into the active region 118, that is, into the source region. The direct contact 134 may include, e.g., doped polysilicon. In some embodiments, the direct contact 134 may include an epitaxial silicon layer. The direct contacts 134 may constitute the direct contacts DC illustrated in FIG. 9.

The bit line structures 140 may be on the insulating layer patterns 112 and 114. Each of the bit line structures 140 may include a bit line 147 and an insulating capping line 148 covering the bit line 147. The bit line structures 140 may extend parallel to each other in the second horizontal direction (the Y direction) parallel to a main surface of the substrate 110. The bit lines 147 may constitute the bit lines BL illustrated in FIG. 9. The bit lines 147 may be electrically connected to the active regions 118 through the direct contacts 134. In some embodiments, the bit line structure 140 may further include a conductive semiconductor pattern 132 located between the insulating layer patterns 112 and 114 and the bit line 147. The conductive semiconductor pattern 132 may include, e.g., doped polysilicon.

The bit line 147 may have a stack structure including a first metal-based conductive pattern 145 and a second metal-based conductive pattern 146 each having a line shape. In some embodiments, the first metal-based conductive pattern 145 may include titanium nitride (TiN) or Ti—Si—N (TSN), and the second metal-based conductive pattern 146 may include tungsten (W) or tungsten silicide (WSix). In some embodiments, the first metal-based conductive pattern 145 may function as a diffusion barrier. In some embodiments, the insulating capping lines 148 may include silicon nitride.

A plurality of insulating spacer structures 150 may cover both sidewalls of the bit line structures 140. Each of the insulating spacer structures 150 may include a first insulating spacer 152, a second insulating spacer 154, and a third insulating spacer 156. In some embodiments, the insulation spacer structures 150 may extend into the direct contact holes 134H and cover both sidewalls of the direct contacts 134. The second insulating spacer 154 may include a material having a permittivity lower than that of the first insulating spacer 152 and the third insulating spacer 156. In some embodiments, the first insulating spacer 152 and the third insulating spacer 156 may include nitride, and the second insulating spacer 154 may include oxide. In some embodiments, the first insulating spacer 152 and the third insulating spacer 156 may include nitride, and the second insulating spacer 154 may include a material having etch selectivity with respect to the first insulating spacer 152 and the third insulating spacer 156. In an implementation, the first insulating spacer 152 and the third insulating spacer 156 may include nitride, and the second insulating spacer 154 may be an air spacer. In some embodiments, the insulating spacer structure 150 may include a second insulating spacer 154 including oxide and a third insulating spacer 156 including nitride.

Each of the insulating fences 180 may be interposed in a space between a pair of insulating spacer structures 150 facing each other between a pair of bit line structures 140 adjacent to each other. The insulation fences 180 may be apart from each other and arranged in a row between the pair of insulation spacer structures 150 facing each other, that is, in the second horizontal direction (the Y direction). In an implementation, the insulation fences 180 may include nitride.

In some embodiments, the insulating fences 180 may pass through the insulating layer patterns 112 and 114 and extend into the dummy buried insulating layer 124. In some other embodiments, the insulating fences 180 may pass through the insulating layer patterns 112 and 114 but may not extend into the dummy buried insulating layer 124, may extend into the insulating layer patterns 112 and 114 but may not pass through the insulating layer patterns 112 and 114, or may not extend into the insulating layer patterns 112 and 114 but may contact the insulating layer patterns 112 and 114 in lower surfaces thereof.

A plurality of buried contact holes 170H may be defined between the insulating fences 180 between each of the bit lines 147. The buried contact holes 170 and the insulating fences 180 may be alternately arranged between a pair of insulating spacer structures 150 facing each other, among the insulating spacer structures 150 covering both sidewalls of the bit line structures 140. An internal space of the buried contact holes 170H may be limited by the insulating spacer structure 150 covering side walls of each of two adjacent bit lines 147 between two adjacent bit lines 147, among the bit lines 147, the insulating fence 180, and the active region 118. In some embodiments, each of the buried contact holes 170H may extend into the active region 118 from between the insulating spacer structure 150 and the insulating fence 180.

The buried contacts 170 may be located in the buried contact holes 170H. The buried contacts 170 may fill a lower portion of a space between the insulation fences 180 and the insulation spacer structures 150 covering both sidewalls of each of the bit line structures 140. The buried contacts 170 and the insulation fences 180 may be alternately arranged between a pair of insulating spacer structures 150 facing each other, among the insulating spacer structures 150 covering both sidewalls of the bit line structures 140, i.e., in the second horizontal direction (the Y direction). In an implementation, the buried contacts 170 may include polysilicon.

In some embodiments, the buried contacts 170 may be arranged in a line in each of the first horizontal direction (the X direction) and the second horizontal direction (the Y direction). Each of the buried contacts 170 may extend from the active region 118 in a vertical direction (a Z direction) perpendicular to the substrate 110. The buried contacts 170 may constitute the buried contacts BC illustrated and shown in FIG. 9.

A level of upper surfaces of the buried contacts 170 may be lower than a level of upper surfaces of insulating capping lines 148. Upper surfaces of the insulating fences 180 may be at the same vertical level as that of the upper surfaces of the insulating capping lines 148 in the vertical direction (Z direction).

A plurality of landing pad holes 190H may be defined by the buried contacts 170, the insulating spacer structures 150, and the insulating fences 180. The buried contacts 170 may be exposed from bottom surfaces of the landing pad holes 190H.

The landing pads 190 may fill at least a portion of the landing pad holes 190H and extend onto the bit line structures 140. The landing pads 190 may be separated from each other by a recess portion 190R. Each of the landing pads 190 may include a conductive barrier layer and a conductive pad material layer on the conductive barrier layer. In an implementation, the conductive barrier layer may include metal, or conductive metal nitride. In some embodiments, the conductive barrier layer may have a Ti/TiN stack structure. In some embodiments, the conductive pad material layer may include tungsten (W). In some embodiments, a metal silicide layer may be formed between the landing pad 190 and the buried contact 170. The metal silicide layer may include cobalt silicide (CoSix), nickel silicide (NiSix), or manganese silicide (MnSix).

The landing pads 190 may be on the buried contacts 170, and the buried contacts 170 may be electrically connected to corresponding landing pads 190, respectively. The landing pads 190 may be connected to the active region 118 through the buried contacts 170. The landing pads 190 may constitute the landing pads LP illustrated and shown in FIG. 9. The buried contact 170 may be located between two adjacent bit line structures 140, and the landing pad 190 may extend from between two bit line structures 140 adjacent to each other with the buried contact 170 therebetween onto one bit line structure 140.

The recess portion 190R may be filled with an insulating structure 195. In some embodiments, the insulating structure 195 may include an interlayer insulating layer and an etch stop layer. In an implementation, the interlayer insulating layer may include an oxide, and the etch stop layer may include a nitride. In an implementation, the etch stop layer may include a silicon nitride layer or silicon boron nitride (SiBN). FIGS. 10A and 10B show that an upper surface of the insulating structure 195 and upper surfaces of the landing pads 190 may be at the same vertical level. In an implementation, the insulating structure 195 may fill the recess portion 190R and cover the upper surfaces of the landing pads 190 to have an upper surface at a vertical level higher than that of the upper surfaces of the landing pads 190.

The capacitor structures 200 may include the lower electrodes 210, the capacitor dielectric layer 220, and the upper electrode 230 may be on the landing pads 190 and the insulating structure 195. The lower electrode 210 may be electrically connected to the landing pad 190 corresponding thereto. FIGS. 10A and 10B show that the upper surface of the insulating structure 195 and a lower surface of the lower electrode 210 may be at the same vertical level.

In some embodiments, the semiconductor device 100 may further include support patterns contacting sidewalls of the lower electrodes 210 to support the lower electrodes 210. The support patterns may include silicon nitride (SiN), silicon carbonitride (SiCN), N-rich silicon nitride (N-rich SiN), or Si-rich silicon nitride (Si-rich SiN). In some embodiments, the support patterns may include a plurality of support patterns contacting sidewalls of the lower electrodes 210 and located at different levels to be apart from each other in the vertical direction (the Z direction).

Each of the lower electrodes 210 may have a solid column shape to have a circular horizontal cross-section, that is, a pillar shape. In some embodiments, each of the lower electrodes 210 may have a cylindrical shape with a lower portion closed. In some embodiments, the lower electrodes 210 may be arranged in a honeycomb arrangement in a zigzag pattern in the first horizontal direction (the X direction) or the second horizontal direction (the Y direction). In some other embodiments, the lower electrodes 210 may be arranged in a matrix form arranged in a row in each of the first horizontal direction (the X direction) and the second horizontal direction (the Y direction). The lower electrodes 210 may include impurity-doped silicon, a metal, such as tungsten or copper, or a conductive metal compound, such as titanium nitride. In some embodiments, the lower electrodes 210 may include TiN, CrN, VN, MoN, NbN, TiSiN, TiAlN, or TaAlN.

The capacitor dielectric layer 220 may conformally cover surfaces of the lower electrodes 210. In some embodiments, the capacitor dielectric layer 220 may be integrally formed to cover surfaces of the lower electrodes 210 together in a certain region, e.g., in one memory cell region (CR in FIG. 9).

The capacitor dielectric layer 220 may include a material having antiferroelectricity, a material having ferroelectricity, or a material having both antiferroelectric and ferroelectric properties. In an implementation, the capacitor dielectric layer 220 may include silicon oxide, or metal oxide. In some embodiments, the capacitor dielectric layer 220 may include a dielectric material including $ABO_3$ or $MO_x$. In an implementation, the capacitor dielectric layer 220 may include SiO, TaO, TaAlO, TaON, AlO, AlSiO, HfO, HfSiO, ZrO, RuO, WO, HfZrO, ZrSiO, TiO, TiAlO, VO, NbO, MoO, MnO, LaO YO, CoO, NiO, CuO, ZnO, FeO, SrO, BaO, BST((Ba,Sr)TiO), STO(SrTiO), BTO(BaTiO), PTO(PbTiO), AgNbO, BiFeO, PZT(Pb(Zr,Ti)O), (Pb,La)(Zr,Ti)O, Ba(Zr,Ti)O, or Sr(Zr,Ti)O.

The upper electrode 230 may be integrally formed on the lower electrodes 210 in a certain region, e.g., in one memory cell region (CR in FIG. 9). The lower electrodes 210, the capacitor dielectric layer 220, and the upper electrode 230 constitute a plurality of capacitor structures 200 within a certain region, e.g., one memory cell region (CR in FIG. 9).

The upper electrode 230 may include impurity-doped silicon, a metal, such as tungsten or copper, or a conductive metal compound, such as titanium nitride. In some embodiments, the upper electrode 230 may include TiN, CrN, VN, MoN, NbN, TiSiN, TiAlN, or TaAlN. In some embodiments, the upper electrode 230 may have a stack structure including at least two of a semiconductor material layer doped with impurities, a main electrode layer, and an interfacial layer. The doped semiconductor material layer may include, e.g., doped polysilicon or doped polycrystalline silicon germanium (SiGe). The main electrode layer may include a metal material. The main electrode layer may include, e.g., W, Ru, RuO, Pt, PtO, Ir, IrO, SRO(SrRuO), BSRO((Ba,Sr)RuO), CRO(CaRuO), BaRuO, or La(Sr,Co)O. In some embodiments, the main electrode layer may include W. The interfacial layer may include a metal oxide, a metal nitride, a metal carbide, or a metal silicide.

FIGS. 11A to 11G are cross-sectional views illustrating a process of manufacturing a semiconductor device according to example embodiments. FIGS. 11A to 11G are cross-sectional views illustrating a process of manufacturing a direct contact hole 134H (refer to FIG. 10A) of the semiconductor device illustrated in FIGS. 9, 10A, and 10B according to example embodiments.

Figure 11A:
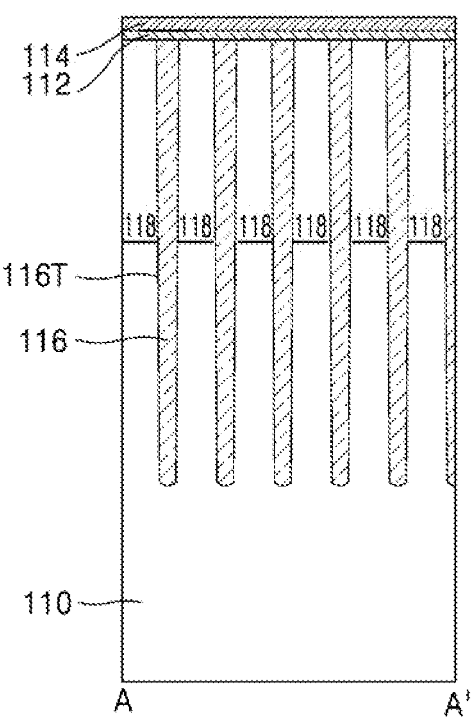
FIGS. 11A to 11G are cross-sectional views illustrating a process of manufacturing a semiconductor device according to example embodiments.
Figure 11A:
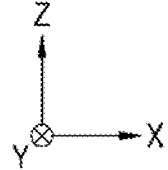

Referring to FIG. 11A, the insulating layer patterns 112 and 114 may be on the substrate 110. The insulating layer patterns 112 and 114 may be on the substrate 110 in which the active region 118 defined by the device isolation layers 116 is located. The insulating layer patterns 112 and 114 may include, e.g., silicon oxide, silicon nitride, silicon oxynitride, or a metal-based dielectric material.

Figure 11B:
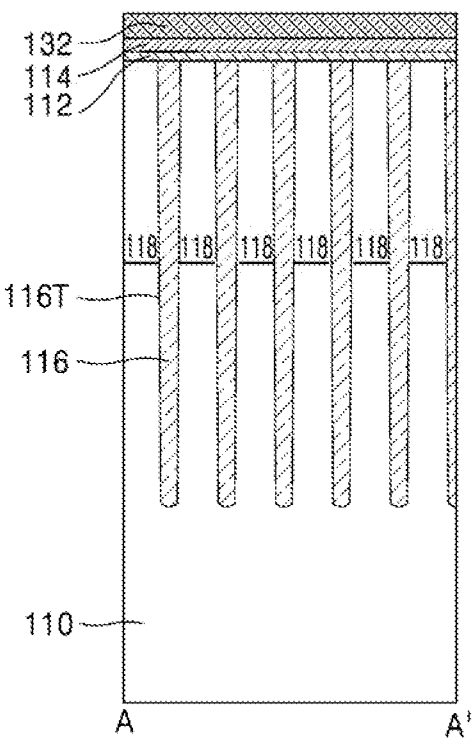
Figure 11B:
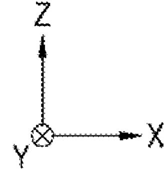

Referring to FIG. 11B, the conductive semiconductor pattern 132 may be on the insulating layer patterns 112 and 114. The conductive semiconductor pattern 132 may be an etch target layer that is etched by a semiconductor device manufacturing method to be described below to form the direct contact hole 134H (refer to FIG. 10A). The conductive semiconductor pattern 132 may include, e.g., doped polysilicon.

Figure 11C:
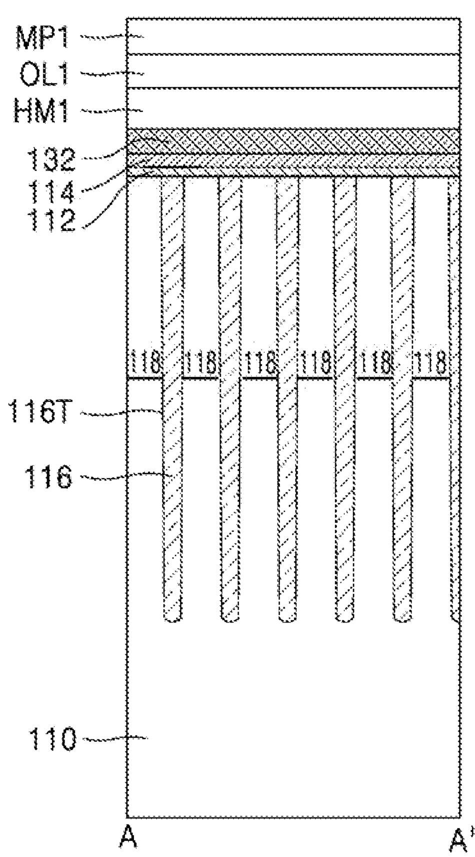
Figure 11C:
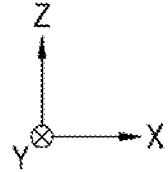

Referring to FIG. 11C, a first hard mask layer HM1, a first organic layer OL1, and a first metal-containing photoresist layer MP1 may be sequentially formed on the conductive semiconductor pattern 132. The first hard mask layer HM1, the first organic layer OL1, and the first metal-containing photoresist layer MP1 may correspond to the hard mask layer 12, the organic layer 13, and the metal-containing photoresist layer 14, respectively, described above with reference to FIGS. 1 to 8.

Figure 11D:
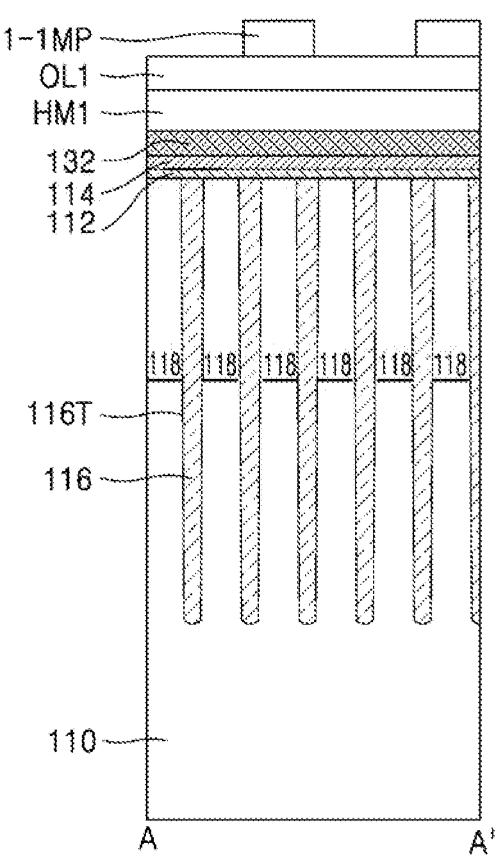
Figure 11D:
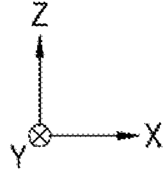

Referring to FIG. 11D, the first metal-containing photoresist layer MP1 (FIG. 11C) may be patterned to form a 1-1 mask pattern 1-1MP exposing a partial region of the first organic layer OL1.

In some embodiments, patterning the first metal-containing photoresist layer MP1 may include exposing only a partial region of the first metal-containing photoresist layer MP1 and removing the rest to form the 1-1 mask pattern 1-1MP. That is, patterning the first metal-containing photoresist layer MP1 may include negative-patterning the first metal-containing photoresist layer MP1.

Figure 11E:
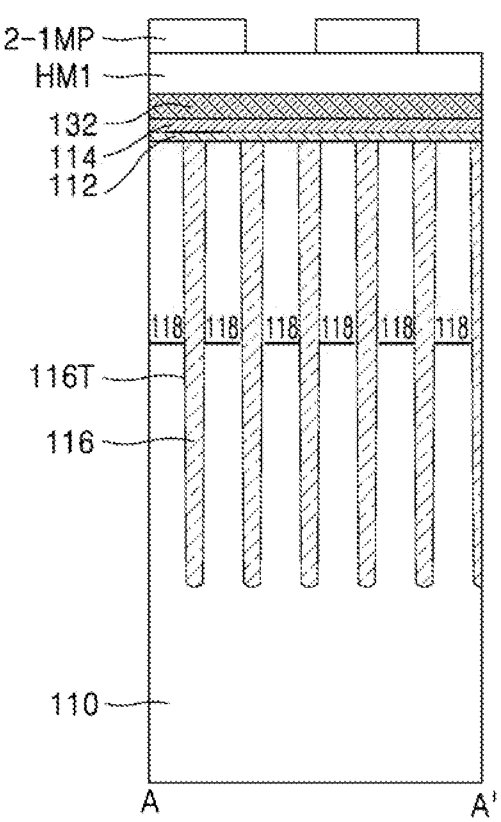
Figure 11E:
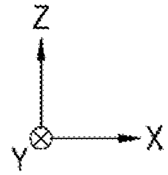

Referring to FIG. 11E, a partial region of the first organic layer OL1 (FIG. 11D) may be removed to form a 2-1 mask pattern 2-1MP exposing a portion of the first hard mask layer HM1.

In some embodiments, an ion implantation process may be performed on a partial region of the first organic layer OL1 exposed by the 1-1 mask pattern 1-1MP (shown in FIG. 11D). Due to the ion implantation process performed on the partial region of the first organic layer OL1, etch selectivity of the partial region having the ion implantation process performed on it may increase compared to the rest of the first organic layer which did not have the ion implantation process performed on it. Etch resistance of the partial region of the first organic layer OL1 may increase, compared to the rest region, by the ion implantation process.

In some embodiments, the 1-1 mask pattern 1-1MP may be removed using a wet etching process or a dry etching process. In some embodiments, the rest region of the first organic layer OL1 not exposed by the 1-1 mask pattern 1-1MP may be removed using a wet etching process or a dry etching process. As described above, because the etch selectivity of the partial region that is ion-implanted to the rest region that is not ion-implanted increases by the ion implantation process, only the rest region may be removed by a wet etching process or a dry etching process.

In some embodiments, the 2-1 mask pattern 2-1MP may be a reverse pattern of the 1-1 mask pattern 1-1MP. That is, the partial region of the first hard mask layer HM1 exposed by the 2-1 mask pattern 2-1MP may be a reverse pattern of the partial region of the first organic layer OL1 exposed by the 1-1 mask pattern 1-1MP.

Figure 11F:
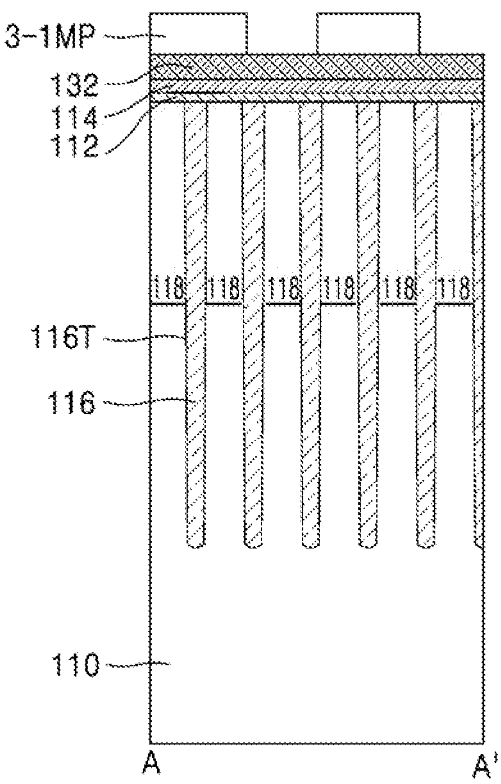
Figure 11F:
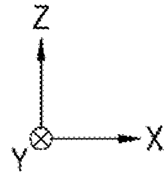

Referring to FIG. 11F, a partial region of the first hard mask layer HM1 (shown in FIG. 11E) may be removed to form a 3-1 mask pattern 3-1MP exposing a portion of the conductive semiconductor pattern 132. The 3-1 mask pattern 3-1 MP may be formed by removing a partial region of the first hard mask layer HM1 exposed by the 2-1 mask pattern 2-1MP (shown in FIG. 11E).

In some embodiments, the 3-1 mask pattern 3-1MP may be a reverse pattern of the 1-1 mask pattern 1-1MP (shown in FIG. 11D). That is, a partial region of the conductive semiconductor pattern 132 exposed by the 3-1 mask pattern 3-1MP may be a reverse pattern of a partial region of the first organic layer OL1 exposed by the 1-1 mask pattern 1-1MP (shown in FIG. 11D).

Figure 11G:
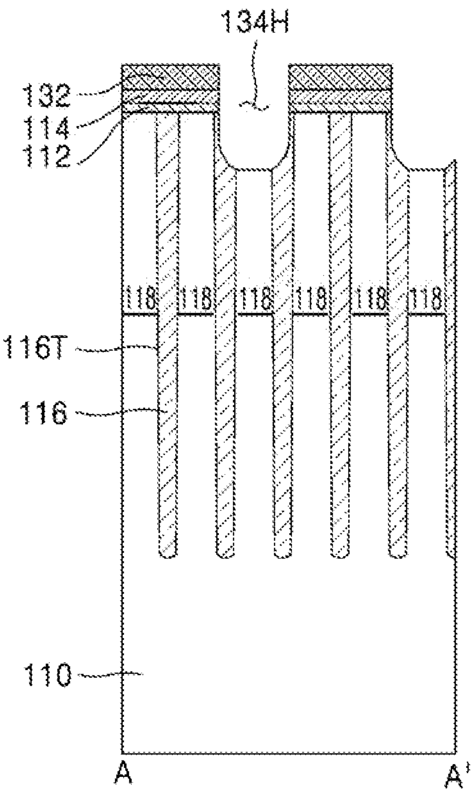
Figure 11G:
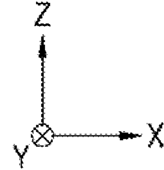

Referring to FIG. 11G, the direct contact hole 134H may be formed by etching the conductive semiconductor pattern 132 and the insulating layer patterns 112 and 114 using the 3-1 mask pattern 3-1MP (shown in FIG. 11F). The conductive semiconductor pattern 132 exposed by the 3-1 mask pattern 3-1MP, the insulating layer patterns 112 and 114 therebelow, and a portion of the substrate 110 may be etched by using the 3-1 mask pattern 3-1MP as an etch mask. In this case, a portion of an upper portion of the device isolation layer 116 may also be removed.

In some embodiments, forming the direct contact hole 134H by etching the conductive semiconductor pattern 132 and the insulating layer patterns 112 and 114 may be a reverse pattern of the 1-1 mask pattern 1-1MP (refer to FIG. 11D).

FIGS. 12A to 12G are cross-sectional views illustrating a process of manufacturing a semiconductor device according to example embodiments. FIGS. 12A to 12G are cross-sectional views illustrating a process of manufacturing the bit line structure (shown as 140 in FIG. 10A) of the semiconductor device shown in FIGS. 9, 10A, and 10B according to example embodiments. FIGS. 12A to 12G are cross-sectional views of a process of manufacturing the bit line structure 140 after forming the direct contact hole 134H by the manufacturing method described above with reference to FIGS. 11A to 11G. FIGS. 12A to 12G are cross-sectional views of a process of manufacturing the bit line structure 140 after forming the direct contact hole 134H by a manufacturing method as will be described above.

Figure 12A:
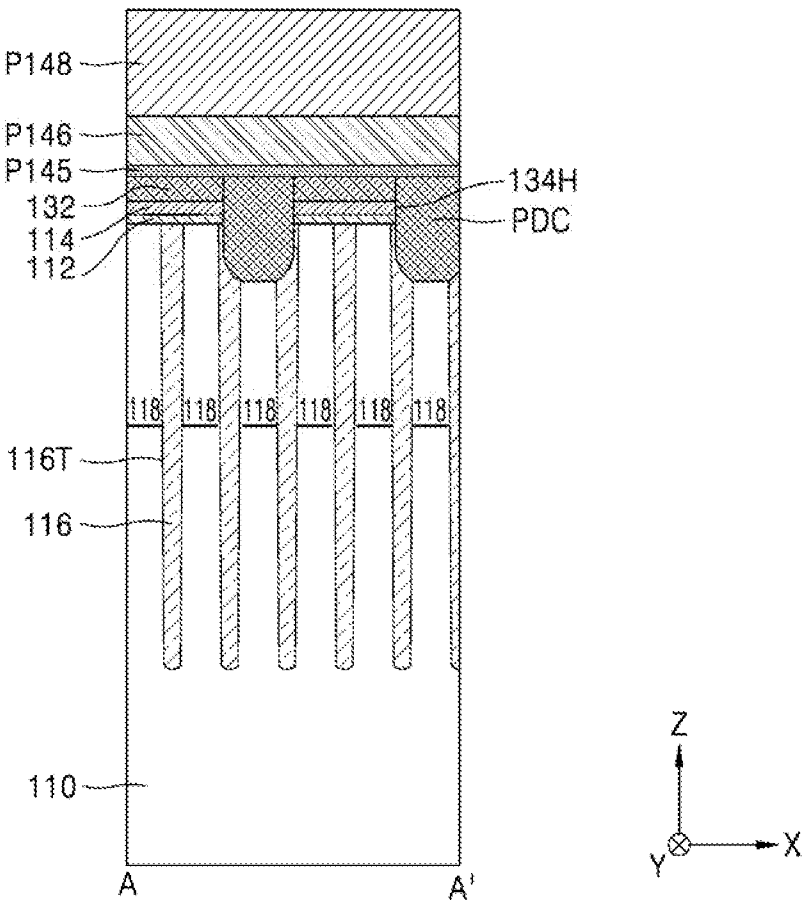
FIGS. 12A to 12G are cross-sectional views illustrating a process of manufacturing a semiconductor device according to example embodiments.

Referring to FIG. 12A, a polysilicon layer doped with impurities may be deposited on the entire surface of the substrate 110 to fill the direct contact hole 134H. Next, a chemical mechanical polishing (CMP) process may be performed to remove the polysilicon layer on the conductive semiconductor pattern 132 to form a pre-direct contact PDC.

Subsequently, a plurality of metal-based conductive layers P145 and P146 and an insulating capping layer P148 may be sequentially stacked on the conductive semiconductor pattern 132 and the pre-direct contact PDC. In some embodiments, the first metal-based conductive layer P145 may include titanium nitride (TiN) or Ti—Si—N (TSN), and the second metal-based conductive layer P146 may include tungsten (W) or tungsten silicide (WSix). In some embodiments, the insulating capping layer P148 may include silicon nitride.

In some embodiments, the metal-based conductive layers P145 and P146 and the insulating capping layer P148 may be etch target layers for forming the bit line structure 140 (shown in FIG. 10A) by the semiconductor device manufacturing method described below. Not only the metal-based conductive layers P145 and P146 and the insulating capping layer P148, but also the conductive semiconductor pattern 132, the pre-direct contact PDC, and the insulating layer patterns 112 and 114 may be etch target layers that are etched by the manufacturing method described below to form the bit line structure 140.

Figure 12B:
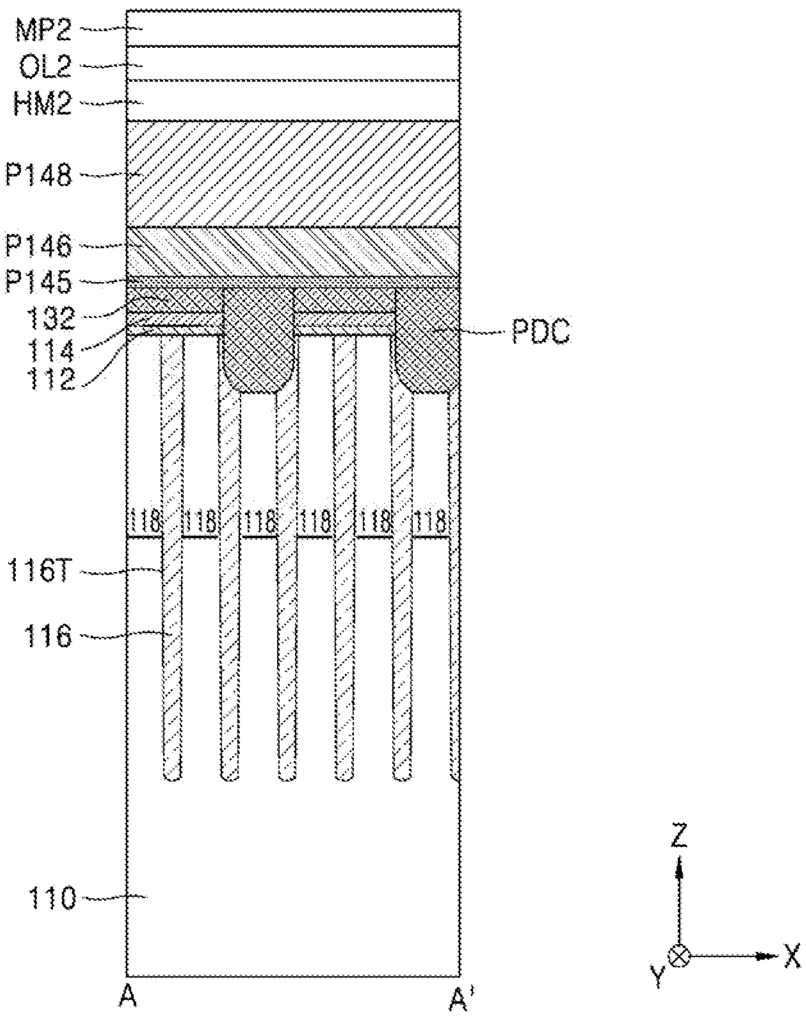

Referring to FIG. 12B, a second hard mask layer HM2, a second organic layer OL2, and a second metal-containing photoresist layer MP2 may be sequentially arranged on the metal-based conductive layers P145 and P146 and the insulating capping layer P148. The second hard mask layer HM2, the second organic layer OL2, and the second metal-containing photoresist layer MP2 may correspond to the hard mask layer 12, the organic layer 13, and the metal-containing photoresist layer 14, respectively, described above with reference to FIGS. 1 to 8.

Figure 12C:
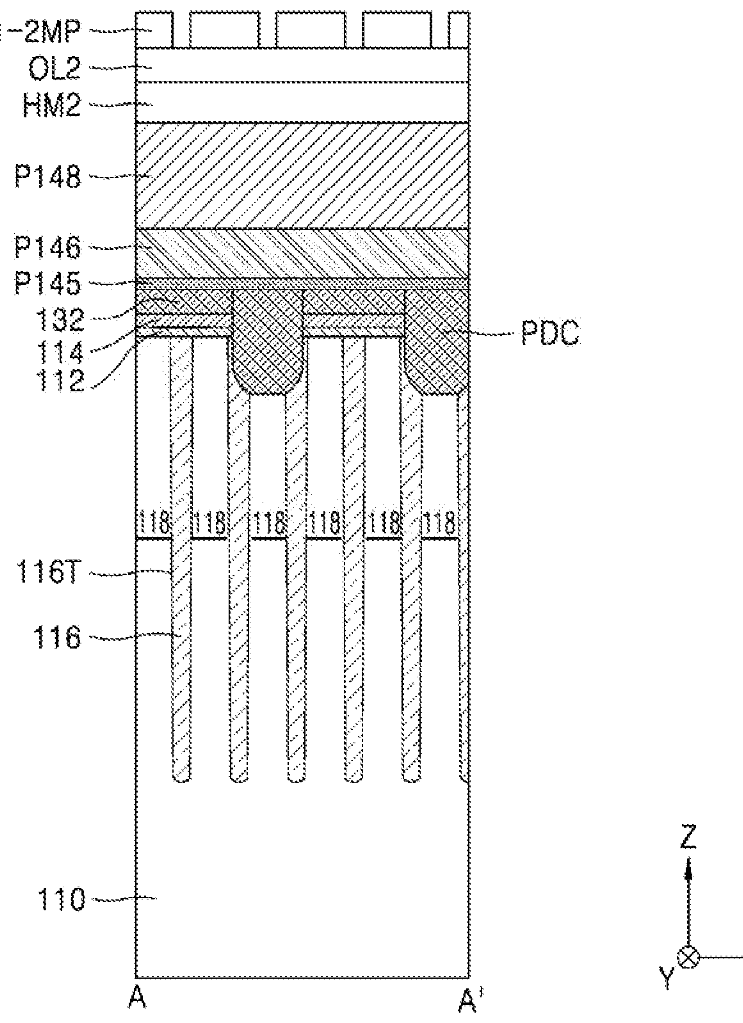
Figure 12C:
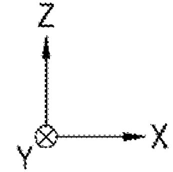

Referring to FIG. 12C, the second metal-containing photoresist layer MP2 (FIG. 12B) may be patterned to form the first-second mask pattern 1-2MP exposing a partial region of the second organic layer OL2.

In some embodiments, patterning the second metal-containing photoresist layer MP2 may include exposing only a partial region of the second metal-containing photoresist layer MP2 and removing the rest unexposed region to form the 1-2 mask pattern 1-2MP. That is, patterning the second metal-containing photoresist layer MP2 may include negative-patterning the second metal-containing photoresist layer MP2.

Figure 12D:
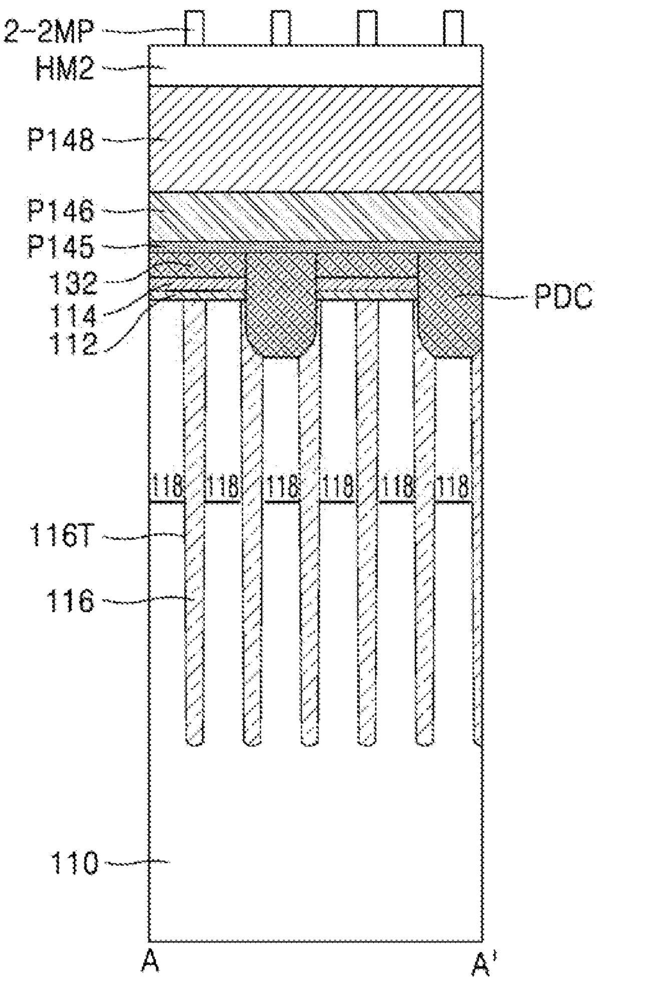
Figure 12D:
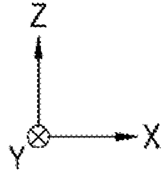

Referring to FIG. 12D, a partial region of the second organic layer OL2 (FIG. 12C) may be removed to form the 2-2 mask pattern 2-2MP and thereby expose a portion of the second hard mask layer HM2. In some embodiments, an ion implantation process may be performed on a partial region of the second organic layer OL2 exposed by the 1-2 mask pattern 1-2MP (refer to FIG. 12C). Due to the ion implantation process performed on the partial region of the second organic layer OL2, etch selectivity of the partial region of the second organic layer OL2 to the rest region may increase. Etch resistance of the partial region of the second organic layer OL2 may increase, compared to the rest region, by the ion implantation process.

In some embodiments, the 1-2 mask pattern 1-2MP may be removed using a wet etching process or a dry etching process. In some embodiments, the rest region of the second organic layer OL2 not exposed by the 1-2 mask pattern 1-2MP may be removed using a wet etching process or a dry etching process. As described above, because etch selectivity of the partial region that is ion-implanted to the rest region that is not ion-implanted increases by the ion implantation process, only the rest region may be removed by a wet etching process or a dry etching process.

In some embodiments, the 2-2 mask pattern 2-2MP may be a reverse pattern of the 1-2 mask pattern 1-2MP. That is, a partial region of the second hard mask layer HM2 exposed by the 2-2 mask pattern 2-2MP may be a reverse pattern of a partial region of the second organic layer OL2 exposed by the 1-2 mask pattern 1-2MP.

Figure 12E:
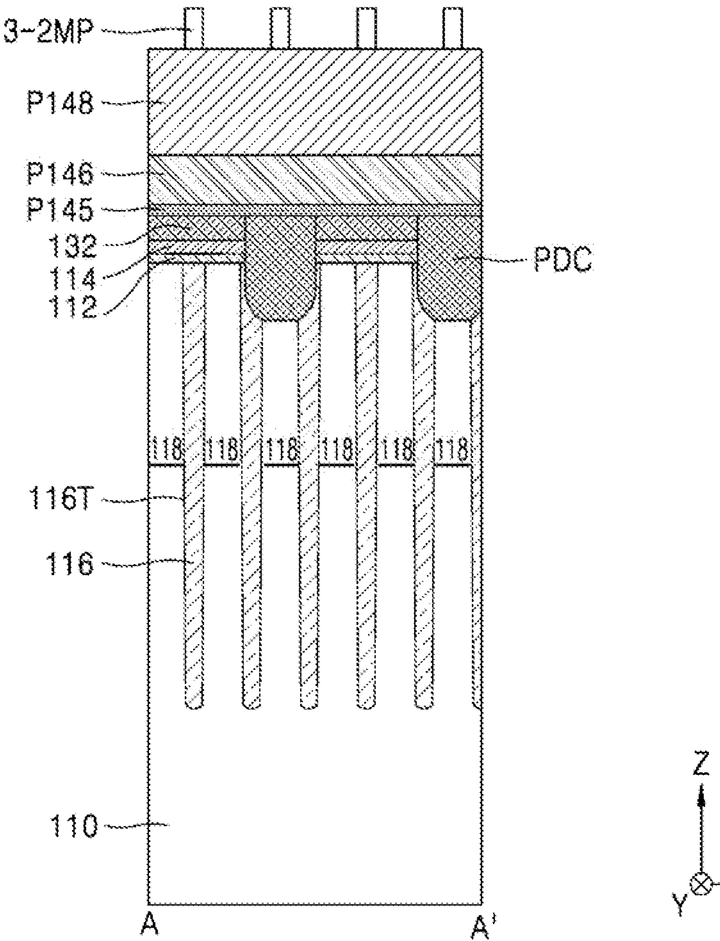
Figure 12E:
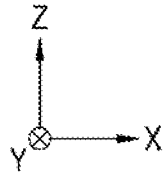

Referring to FIG. 12E, a partial region of the second hard mask layer HM2 (shown in FIG. 12D) may be removed to form a 3-2 mask pattern 3-2MP exposing a portion of the insulating capping line 148. The 3-2 mask pattern 3-2MP may be formed by removing a partial region of the second hard mask layer HM2 exposed by the 2-2 mask pattern 2-2MP (shown in FIG. 12D).

In some embodiments, the 3-2 mask pattern 3-2MP may be a reverse pattern of the 1-2 mask pattern 1-2MP (shown in FIG. 12C). That is, a partial region of the insulating capping line 148 exposed by the 3-2 mask pattern 3-2MP may be the reverse of a partial region of the second organic layer OL2 (shown in FIG. 12C) exposed by the 1-2 mask pattern 1-2MP.

Figure 12F:
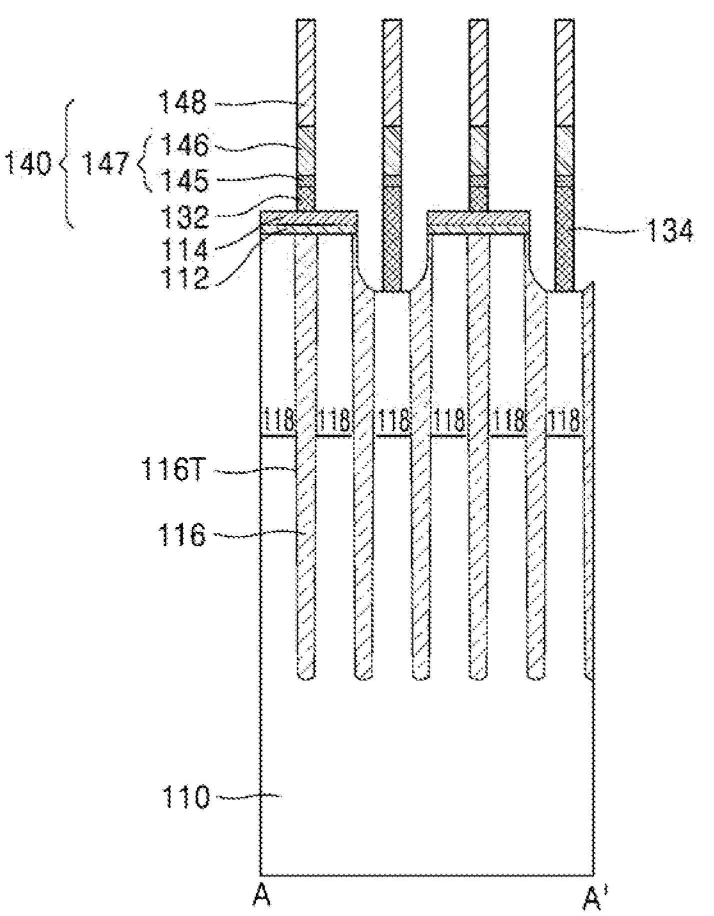
Figure 12F:
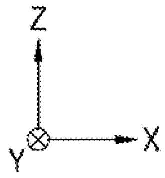

Referring to FIG. 12F, the metal-based conductive layers P145 and P146 (refer to FIG. 12E) and the insulating capping layer P148 (shown in FIG. 12E) may be etched by using the mask pattern 3-2MP (shown in FIG. 12E) as an etch mask to form the metal conductive patterns 145 and 146 and the insulating capping line 148. By using the 3-2 mask pattern 3-2MP as an etch mask, the metal-based conductive layers P145 and P146, the insulating capping layer P148, the conductive semiconductor pattern 132, the pre-direct contact PDC, and the insulating layer patterns 112 and 114 exposed by the 3-2 mask pattern 3-2MP may be etched to form the bit line 147, the insulating capping line 148, and the bit line structure 140 including the bit line 147 and the insulating capping line 148, and the direct contact 134.

The metal conductive patterns 145 and 146 may include the first metal-based conductive pattern 145 and the second metal-based conductive pattern 146 described above with reference to FIGS. 9, 10A, and 10B. In some embodiments, the first metal-based conductive pattern 145 may include titanium nitride (TiN) or Ti—Si—N(TSN), and the second metal-based conductive pattern 146 may include tungsten (W) or tungsten silicide (WSix). The insulating capping line 148 may correspond to the insulating capping line 148 described above with reference to FIGS. 9, 10A, and 10B. In some embodiments, the insulating capping line 148 may include silicon nitride.

Figure 12G:
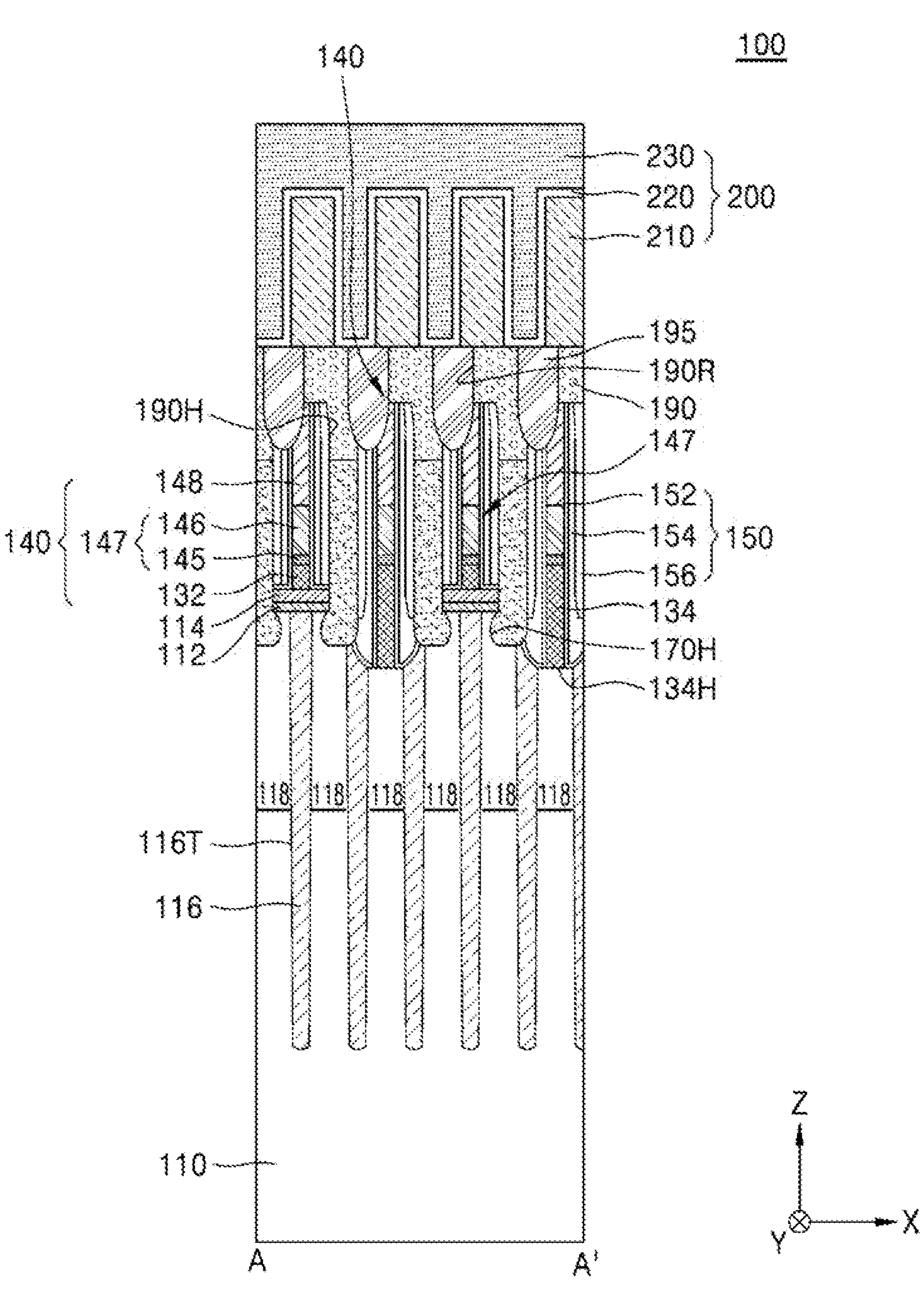

Referring to FIG. 12G, the insulating spacer structure 150 may be formed to cover sidewalls of the insulating capping line 148 and the bit line 147. The insulating spacer structure 150 may correspond to the insulating spacer structure 150 described above with reference to FIGS. 9, 10A, and 10B.

Subsequently, the insulating fences 180 located between the insulating spacer structures 150, the buried contacts 170 located between the insulating fences 180, the landing pads 190 on the buried contacts 170, and the capacitor structures 200 on the landing pads 190 may be sequentially formed to provide the semiconductor device 100 according to example embodiments.

By way of summation and review, semiconductor devices having a high degree of integration used in electronic devices have been required, so that design rules for components of the semiconductor devices have been reduced. A method of manufacturing a semiconductor device having improved performance and reliability is disclosed.

The problems to be solved are not limited to the problems mentioned above, and other problems not mentioned will be clearly understood by those skilled in the art from the description above.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, comprising:
- sequentially disposing a hard mask layer, an organic layer, and a metal-containing photoresist layer on a substrate;
- patterning the metal-containing photoresist layer to form a first mask pattern exposing a first region of the organic layer;
- implanting ions into the first region of the organic layer exposed by the first mask pattern;
- removing the first mask pattern and a second region of the organic layer that is not ion-implanted to form a second mask pattern exposing a partial region of the hard mask layer; and
- removing the partial region of the hard mask layer exposed by the second mask pattern to form a third mask pattern.

2. The method as claimed in claim 1, wherein the forming of the first mask pattern includes:
- exposing a partial region of the metal-containing photoresist layer; and
- removing a rest unexposed region to form the first mask pattern.

3. The method as claimed in claim 1, wherein the first mask pattern includes a metal oxide obtained by oxidizing metal of the metal-containing photoresist layer.

4. The method as claimed in claim 1, wherein the implanting of ions into the first region of the organic layer includes increasing an etch selectivity of the first region, which is ion-implanted, of the organic layer to the second region that is not ion-implanted.

5. The method as claimed in claim 1, wherein the implanting of ions into the first region of the organic layer includes increasing an etch selectivity of the first region, which is ion-implanted, of the organic layer to the hard mask layer.

6. The method as claimed in claim 1, wherein the metal-containing photoresist layer includes tin (Sn), antimony (Sb), cobalt (Co), hafnium (Hf), or palladium (Pd).

7. The method as claimed in claim 1, wherein the ions implanted into the first region of the organic layer include boron ions, carbon ions, argon ions, phosphorus ions, sulfur ions, or arsenic ions.

8. The method as claimed in claim 1, wherein the second mask pattern is a reverse pattern of the first mask pattern.

9. The method as claimed in claim 1, wherein the forming of the second mask pattern includes performing wet etching or dry etching on the first mask pattern and the second region, which is not ion-implanted, of the organic layer.

10. The method as claimed in claim 1, wherein the third mask pattern is a reverse pattern of the first mask pattern.

11. A method of manufacturing a semiconductor device, comprising:

providing a substrate in which an active region defined by a device isolation layer is located;

forming a word line extending in a first horizontal direction within the substrate;

forming an etch target layer on the substrate;

sequentially forming a hard mask layer, an organic layer, and a metal-containing photoresist layer covering the etch target layer;

patterning the metal-containing photoresist layer to form a first mask pattern exposing a first region of the organic layer;

implanting ions into the first region of the organic layer exposed by the first mask pattern;

removing the first mask pattern and a second region, which is not ion-implanted, of the organic layer to form a second mask pattern exposing a partial region of the hard mask layer;

removing the partial region of the hard mask layer exposed by the second mask pattern to form a third mask pattern exposing a portion of the etch target layer; and etching the etch target layer using the third mask pattern.

12. The method as claimed in claim 11, wherein the etching of the etch target layer includes etching the etch target layer to form a bit line extending in a second horizontal direction crossing the first horizontal direction on the substrate.

13. The method as claimed in claim 11, further comprising:

forming a bit line extending in a second horizontal direction crossing the first horizontal direction on the substrate after the etching of the etch target layer, wherein the etching of the etch target layer includes forming a direct contact hole in which a direct contact electrically connecting the bit line to the active region is located.

14. The method as claimed in claim 11, wherein the forming of the first mask pattern includes:

exposing a partial region of the metal-containing photoresist layer; and removing a rest unexposed region to form the first mask pattern.

15. The method as claimed in claim 11, wherein the second mask pattern is a reverse pattern of the first mask pattern.

16. The method as claimed in claim 11, wherein the third mask pattern is a reverse pattern of the first mask pattern.

17. The method as claimed in claim 11, wherein the etching of the etch target layer includes forming a pattern which is a reverse pattern of the first mask pattern.

18. A method of manufacturing a semiconductor device, comprising:

sequentially disposing an etch target layer, a hard mask layer, an organic layer, and a metal-containing photoresist layer on a substrate;

negative-patterning the metal-containing photoresist layer to form a first mask pattern exposing a first region of the organic layer;

implanting ions into the first region of the organic layer exposed by the first mask pattern;

removing the first mask pattern;

removing a second region, that is not ion-implanted, of the organic layer to form a second mask pattern exposing a partial region of the hard mask layer;

removing the partial region of the hard mask layer exposed by the second mask pattern to form a third mask pattern exposing a portion of the etch target layer; and etching the etch target layer using the third mask pattern, wherein the etching of the etch target layer includes forming a pattern which is a reverse pattern of the first mask pattern.

19. The method as claimed in claim 18, wherein the metal-containing photoresist layer includes tin (Sn), antimony (Sb), cobalt (Co), hafnium (Hf), or palladium (Pd).

20. The method as claimed in claim 18, wherein the ions implanted into the first region of the organic layer include boron ions, carbon ions, argon ions, phosphorus ions, sulfur ions, or arsenic ions.

* * * * *